(12) United States Patent
Chatal et al.

(10) Patent No.: US 7,576,678 B2
(45) Date of Patent: Aug. 18, 2009

(54) SUCCESSIVE APPROXIMATION ANALOG/DIGITAL CONVERTER AND ASSOCIATED INTEGRATED COMPONENT AND CONVERSION METHOD

(75) Inventors: Joel Chatal, Carquefou (FR); Abdellatif Bendraoui, Saint-Julien de Concelles (FR)

(73) Assignee: Atmel Nantes SA, Nantes Cedex (FR)

( * ) Notice: Subject to any disclaimer, the term of this patent is extended or adjusted under 35 U.S.C. 154(b) by 0 days.

(21) Appl. No.: 11/925,060

(22) Filed: Oct. 26, 2007

(65) Prior Publication Data

US 2008/0100490 A1 May 1, 2008

(30) Foreign Application Priority Data

Oct. 26, 2006 (FR) .................................. 06 09418

(51) Int. Cl.
H03M 1/34 (2006.01)
(52) U.S. Cl. .................. 341/163; 341/155; 341/156
(58) Field of Classification Search .................. 341/155, 341/156, 163
See application file for complete search history.

(56) References Cited

U.S. PATENT DOCUMENTS

| | | | | |
|---|---|---|---|---|
| 3,781,871 A | | 12/1973 | Mattern ...................... 340/347 |
| 4,851,838 A | * | 7/1989 | Shier ........................... 341/121 |
| 5,870,052 A | * | 2/1999 | Dedic et al. .................. 341/161 |
| 6,028,545 A | * | 2/2000 | Chen ............................ 341/156 |
| 6,329,938 B1 | | 12/2001 | Spaur et al. .................. 341/118 |
| 2003/0218561 A1 | | 11/2003 | Hales .......................... 341/163 |

FOREIGN PATENT DOCUMENTS

| | | |
|---|---|---|
| EP | 0 164 747 A2 | 6/1985 |
| EP | 1 583 244 B1 | 4/2004 |

OTHER PUBLICATIONS

International Search Report of the European Patent Office in counterpart foreign application No. FR 06/09418 filed Oct. 26, 2006, pp. 1-2.

* cited by examiner

Primary Examiner—Jean B Jeanglaude
(74) Attorney, Agent, or Firm—Westman, Champlin & Kelly, P.A.

(57) ABSTRACT

A successive approximation analog/digital converter is provided, which includes a successive approximation register supplying a digital/analog converter, first means of comparing an input signal of the analog/digital converter to an output signal of the digital/analog converter delivering a first comparison signal, said successive approximation analog/digital converter being synchronised by a clock signal coming from a conversion clock. A method such as this includes dynamic adaptation of the conversion clock period based on at least one parameter.

13 Claims, 10 Drawing Sheets

SUCCESSIVE APPROXIMATION ANALOG/DIGITAL CONVERTER AND ASSOCIATED INTEGRATED COMPONENT AND CONVERSION METHOD

CROSS-REFERENCE TO RELATED APPLICATION

None.

FIELD OF THE DISCLOSURE

The field of the disclosure is that of analog/digital converters, and more particularly successive-approximation type analog/digital converters.

More precisely, the disclosure relates to generating the clock for a successive-approximation type analog/digital converter (hereinafter designated as successive approximation ADC).

BACKGROUND OF THE DISCLOSURE

A simplified block diagram of a conventional successive approximation analog/digital converter 1000 is shown in FIG. 1.

The successive approximation ADC 1000 includes:
- an digital/analog converter 110 (hereinafter referenced as DAC);
- a sample-and-hold device 150, the input of which corresponds to the successive approximation ADC 1000 input, and which is therefore supplied with the ADC 1000 input voltage, hereinafter referenced as voltage VIN, and the output of which, supplying a voltage hereinafter referenced as voltage Vin1, is connected to the input of a comparator 120 described hereinbelow. The voltage Vin1 is equal to the input voltage Vin at the end of the sampling phase (described hereinbelow). The sample-and-hold device 150 enables the input voltage Vin of the successive approximation ADC 1000 to be stabilised during the conversion phase;
- a comparator 120 of which a first input 121 is supplied with the output voltage Vin1 of the sample-and-hold device 150, a second input 122 is supplied with an output voltage (analog) of the DAC 110 (hereinafter referenced as Vdac) delivered to an output 112 of the DAC 110 and an output 123 delivering an output voltage hereinafter referenced as Vcomp;
- a successive approximation register 130 (SAR) of which a first input 131 is supplied with the output voltage Vcomp, a second input 132 is supplied with a voltage delivered by a conversion clock hereinafter referenced as CLK, and a set of n outputs (hereinafter referenced as a1, a2, ..., an) 133 (n being a natural number equal to 10, for example) which supplies n inputs 111 of the DAC 110;
- a circuit (optional) for storing the conversion result 140 of which a first input 141 is supplied by the output voltage Vcomp, n second inputs 142 are connected to the n outputs 133, respectively, of the register 130 and n outputs (hereinafter referenced as b1 to bn) 143 deliver the successive approximation ADC output voltage hereinafter referenced as Vout.

A complete conversion cycle includes a sampling phase and a conversion phase. A cycle such as this requires m period(s) of the conversion clock (m being a natural number greater than or equal to one) for the sampling operation and n period(s) of the conversion clock for the analog-digital conversion operation (n being the number of bits). For example, it will hereinafter be assumed that the conversion operation is carried out on n=10 bits and that the sampling operation is carried out on 3 bits.

The conversion clock period of a conventional successive approximation ADC 1000 such as this is initially set as constant and remains so throughout the entire conversion cycle.

The choice of the conversion clock period depends on the DAC 110 set-up time and on the comparator 120 response time.

FIG. 2 shows time-dependent curves for the CLK voltages and the signals, referenced as d<9:0>, coming from the outputs b1 to bn, over one conversion phase (step 0 to step 9).

During a conversion phase 201, the output 112 of the DAC 110 generates an output voltage Vdac which, in a first conversion step, assumes a first value Vref/2 (which corresponds to a "1" on the bit of the output a1 of the SAR 130). In a second conversion step, based on the voltage at the output 123 of the comparator 120, the output a1 is maintained at "1" or reset to "0," and the output Vdac assumes the value a1*Vref/2+Vref/4 (which corresponds to a "1) on the bit of the output a2 of the SAR 130). In a tenth conversion step, based on the voltage at the output 123 of the comparator 120, the output a9 is maintained at "1" or reset to "0," the voltage Vdac assumes a value a1*Vref/2+a2*Vref/4+a3*Vref/8+a4*Vref/16+a5*Vref/32+a6*Vref/64+a7*Vref/128+a8*Vref/256+a9*Vref/512+Vref/1024 (which corresponds to a "1" on the bit of the output a10 of the SAR 130), Vref being a constant reference voltage. Finally, based on the voltage at the output 123 of the comparator 120, the output a10 is maintained at "1" or reset to "0".

Hereinafter, the bit of the output a1 will be designated as the most significant bit (hereinafter designated as MSB), and the bit of the output a10 as the least significant bit (hereinafter designated as LSB).

Over the course of a conversion phase, the comparator 120 compares the output voltage Vdac to the input voltage Vin, for each of the aforesaid steps. The results of these comparisons, hereinafter referenced as b1, b2, ... and b10, are stored in the conversion result storage circuit 140.

The clock frequency is limited both by the DAC 110 converter set-up time and by the comparator 120 response time.

For each conversion step of the conversion phase, Vdac must be established with a degree of accuracy at least equal to half the value of the least significant bit (LSB) which assumes the value Vref/1024.

FIG. 3 shows the evolution of the signal Vdac in relation to time t, in the case where Vdac assumes the value of the least significant bit (curve 301) and in the case where Vdac assumes the value of the most significant bit (curve 302).

Thus, Vdac assumes a time t1 in order to be established with a degree of accuracy at least equal to half the value of the least significant bit (LSB), and a time t2 in order to be established with a degree of accuracy at least equal to the least significant bit (LMSB). It can be noted that t1 is much less than t2.

The output voltage Vcomp of the comparator 120 can switch from 0 to 1 or from 1 to 0. The response time of the comparator 120 depends on the absolute value of the difference between the input voltage Vin of the successive approximation ADC 1000 and the output voltage Vdac of the DAC 110.

FIGS. 4 and 5, respectively, show curves of the voltages Vin, Vdac, Vcomp and CLK (in V), in relation to time (in s), in the case where the voltage Vdac is substantially equal to 0.0207 V and Vin is substantially equal to 0.380 V (FIG. 4), and in a case where the voltage Vdac is substantially equal to 0.380 V and Vin is substantially equal to 0.383 V (FIG. 5).

Thus, in the case where the voltage Vdac is substantially equal to 0.207 V and Vin is substantially equal to 0.380 V, the comparator 120 response time equals 16 ns, and in the case where the voltage Vdac is substantially equal to 0.380 V and Vin is substantially equal to 0.383 V, the comparator 120 response time equal 47 ns.

Consequently, the lower the absolute value of the difference between Vin and Vdac, the longer the comparator 120 response time.

A new value for the output voltage of the DAC 110 (corresponding to a new conversion step) is applied to the second input 122 of the comparator 120 so as to be synchronised with a current rise or fall in the clock CLK voltage, and then the value of the output voltage of the comparator 120, corresponding to the comparison of this new value for the output voltage of the ADC 110 with Vin1, is stored during the following rise or fall in the clock CLK voltage.

Thus, the minimum conversion clock period corresponds to the sum of the DAC 110 converter set-up time and the comparator 120 response time.

In a conventional successive approximation ADC, in order to ensure that the conversion clock period will be sufficiently long to be able to carry out the conversion operation with the degree of accuracy required for all of the values of the signal Vin, a clock period is generally chosen which is constant and equal to the sum of the DAC converter set-up time, in the case of the most significant bit (MSB) and the comparator response time, in the case of the slightest difference between the voltage Vin and the voltage Vdac (substantially equal to the value of the least significant bit or LSB).

In this way, one is placed in the least favourable situation in terms of the speed of the conversion operation, and, at each of the conversion steps, a loss of conversion time is thus observed for the majority of the input voltages Vin.

This loss of time is shown in relation to FIG. 6, which shows voltage curves Vin, Vdac, Vcomp and CLK (in V) in relation to time t (in µs), in a case where Vin is substantially equal to 0.7 V and where the conversion clock period is substantially equal to 0.2 µs.

A switching of the comparator 120 is observed at the moment when Vdac assumes a value of approximately 0.4 V. It can be observed that, in order for Vdac to be equal to 0.4 V, the sum of the DAC 110 converter set-up time and the comparator response time (which is of the order of 0.02 µs) is much lower than the conversion clock period. Thus, in the case of this conversion step, a time loss of substantially 0.18 µs is observed.

SUMMARY

An aspect of the disclosure relates to a successive approximation analog/digital converter comprising a successive approximation register supplying a digital/analog converter, first means of comparing an input signal of the analog/digital converter to an output signal of the digital/analog converter delivering a first comparison signal, said successive approximation analog/digital converter being synchronised by a clock signal coming from a conversion clock.

The converter includes means for dynamic adaptation of the conversion clock period on the basis of at least one parameter and the means for dynamic adaptation of the conversion clock period include means of measuring at least one response time of the first means of comparison and/or means of measuring at least one set-up time for at least one analog voltage via the digital/analog converter.

The basic principle of an aspect of the disclosure is based on the dynamic adaptation of the conversion clock period of a successive approximation ADC, whereby the period is reduced when it is not detrimental to the quality of the conversion operation.

Thus, this dynamic adaptation of the conversion clock period enables improvement in the conversion speed of a successive approximation analog/digital converter.

In comparison with the case of a clock the period of which is constant, this adaptation makes it possible, in particular, to reduce the amount of time lost during the conversion phase, which is due to the conversion clock period.

The means for dynamic adaptation of the conversion clock period preferably include means of measuring at least one response time of the first means of comparison and/or means of measuring at least one set-time for at least one analog voltage via the digital-analog converter.

Thus, for example, the parameter is at least one response time of the first means of comparison and/or at least one time for setting up at least one analog voltage via the digital/analog converter.

According to one advantageous characteristic of the disclosure, the measurement means include second means of comparing the input signal of the analog/digital converter to the output signal of the digital/analog converter delivering a second comparison signal supplying means of generating said conversion clock, and the means of generating said conversion clock take account of the first and second comparison signals.

The measurement means are advantageously adapted for also measuring at least one response time of the second means of comparison.

Preferably, the first means of comparison include a first comparator, the second means of comparison include a second comparator, and the first and second comparators are identical.

According to one embodiment of the disclosure, the second means of comparison include means of multiplexing the input signal of the analog/digital converter and the output signal of the digital/analog converter to first and second inputs of the second comparator taking account of the clock signal.

The multiplexing means advantageously include at least one interrupter controlled by the clock signal and at least one interrupter controlled by the inverse of the clock signal.

Said means of generating the conversion clock advantageously include at least one EXCLUSIVE-OR gate.

Said means of generating the conversion clock preferably include time-delay means applied to said clock signal.

Thus, a time delay makes it possible to guarantee a minimum clock period width, in particular for the logic implemented in the successive approximation register.

According to one embodiment of the disclosure, the means of generating the conversion clock include means of reducing the clock signal period.

It is thus possible to obtain a clock signal the clock period of which is optimised throughout the conversion phase.

Said means of reducing the clock period advantageously include two inverters mounted in serial.

Said means of reducing the clock period advantageously include means of insulating the analog/digital converter from noise generated by the dynamic adaptation means.

Said insulation means preferably include at least one follower amplifier assembly.

According to one embodiment of the disclosure, said at least one parameter belongs to the group comprising the:
response time of the first comparison means;
time for setting up at least one analog voltage via the digital-analog converter;
input signal of the analog/digital converter;

operating temperature of the analog/digital converter;
method of manufacturing the analog/digital converter.

The disclosure also relates to an integrated component comprising at least one successive approximation analog/digital converter as described previously.

The disclosure also relates to a successive approximation method of converting an analog input signal into a digital output signal, which is implemented by a successive approximation analog/digital converter comprising a successive approximation register supplying a digital/analog converter, first means of comparing an input signal of the analog/digital converter to an output signal of the digital/analog converter delivering a first comparison signal.

Said successive approximation conversion is synchronised by a clock signal coming from a conversion clock.

The method includes a step for dynamic adaptation of the conversion clock period based on at least one parameter and the step for dynamic adaptation of the conversion clock period includes a step for measuring at least one response time of the first comparison means and/or a step for measuring at least one set-up time for at least one analog voltage via the digital/analog converter.

The advantages of the integrated component and of the successive approximation conversion operation are substantially the same as those of the successive approximation method, and are not specified more fully.

BRIEF DESCRIPTION OF THE DRAWINGS

Other characteristics and advantages will become more apparent upon reading the following description of particular embodiments, given as purely illustrative and non-limiting examples, and of the appended drawings, in which.

DETAILED DESCRIPTION OF ILLUSTRATIVE EMBODIMENTS

Figure 7:
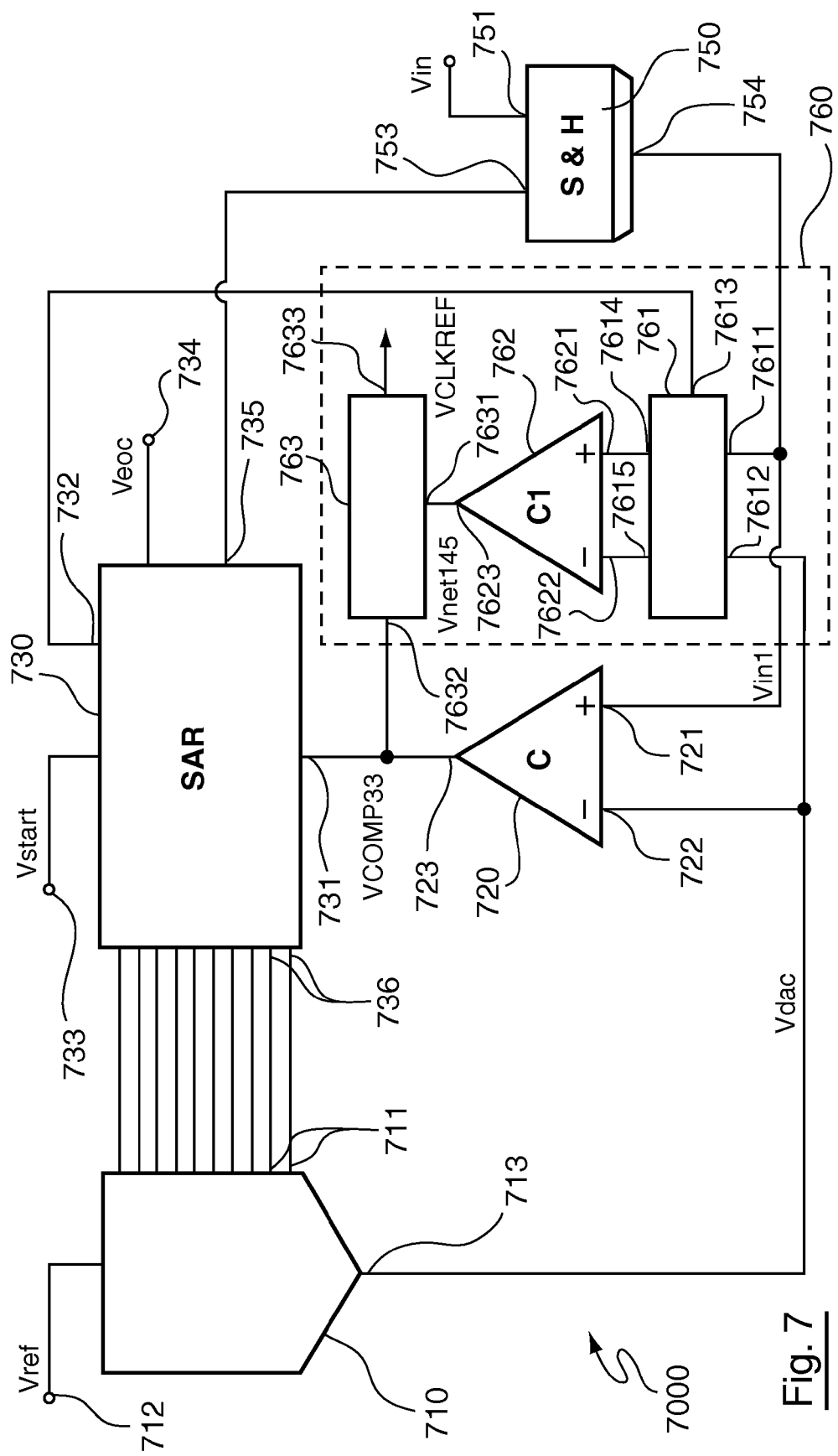
FIG. 7 shows a simplified block diagram of a successive approximation analog/digital converter according to one particular embodiment of the disclosure.

FIG. 7 shows a simplified block diagram of a successive approximation analog/digital converter according to one particular embodiment of the disclosure.

The successive approximation ADC 7000 includes:

a digital/analog converter 710 (hereinafter referenced as DAC) supplied at a first input 712 with a constant reference voltage (or signal) Vref;

a sample-and-hold device 750 of which a first input 751 is supplied with the input voltage (or signal) Vin (analog) of the successive approximation ADC, a second input 753 is connected to a first output 735 of the SAR 730 which delivers a hold signal, hereinafter referenced as Vhold, and an output 754 delivers a signal Vin1 the value of which is stable and the value of which is equal to that of the input voltage Vin at the end of the sampling period, during the conversion phase;

a first comparator 720 of which a first input 721 is supplied with the voltage (or signal) Vin1 delivered to the output 754 of the sample-and-hold device 750, a second input 722 is supplied with an output voltage (or signal) (analog) of the DAC 710 (hereinafter referenced as Vdac) delivered to an output 713 of the DAC 710, and an output 723 delivers an output voltage (or signal) (or first comparison voltage resulting from the comparison of the voltages Vin1 and Vdac) hereinafter referenced as Vcomp33;

a successive approximation register 730 (SAR) of which a first input 731 is supplied with the output voltage Vcomp33, a second input 732 is supplied with a clock voltage (or signal) (hereinafter referenced as VCLKREF) delivered by a circuit 760 for dynamic adaptation of the conversion clock period described hereinbelow, a third input 733 is supplied with an initialisation signal hereinafter referenced as "Vstart," an output 734 delivering an end-of-conversion-cycle indication signal (or EOC for "End of Cycle") hereinafter referenced as Veoc, and a set of n second outputs (hereinafter referenced by a1 to a10) 736 which supply n second inputs 711 of the DAC 719 (n is the number of bits of the conversion operation, and hereinafter, for example, it is chosen to be equal to 10);

a circuit for dynamic adaptation 760 of the conversion clock period of the successive approximation ADC 7000.

Figure 1:
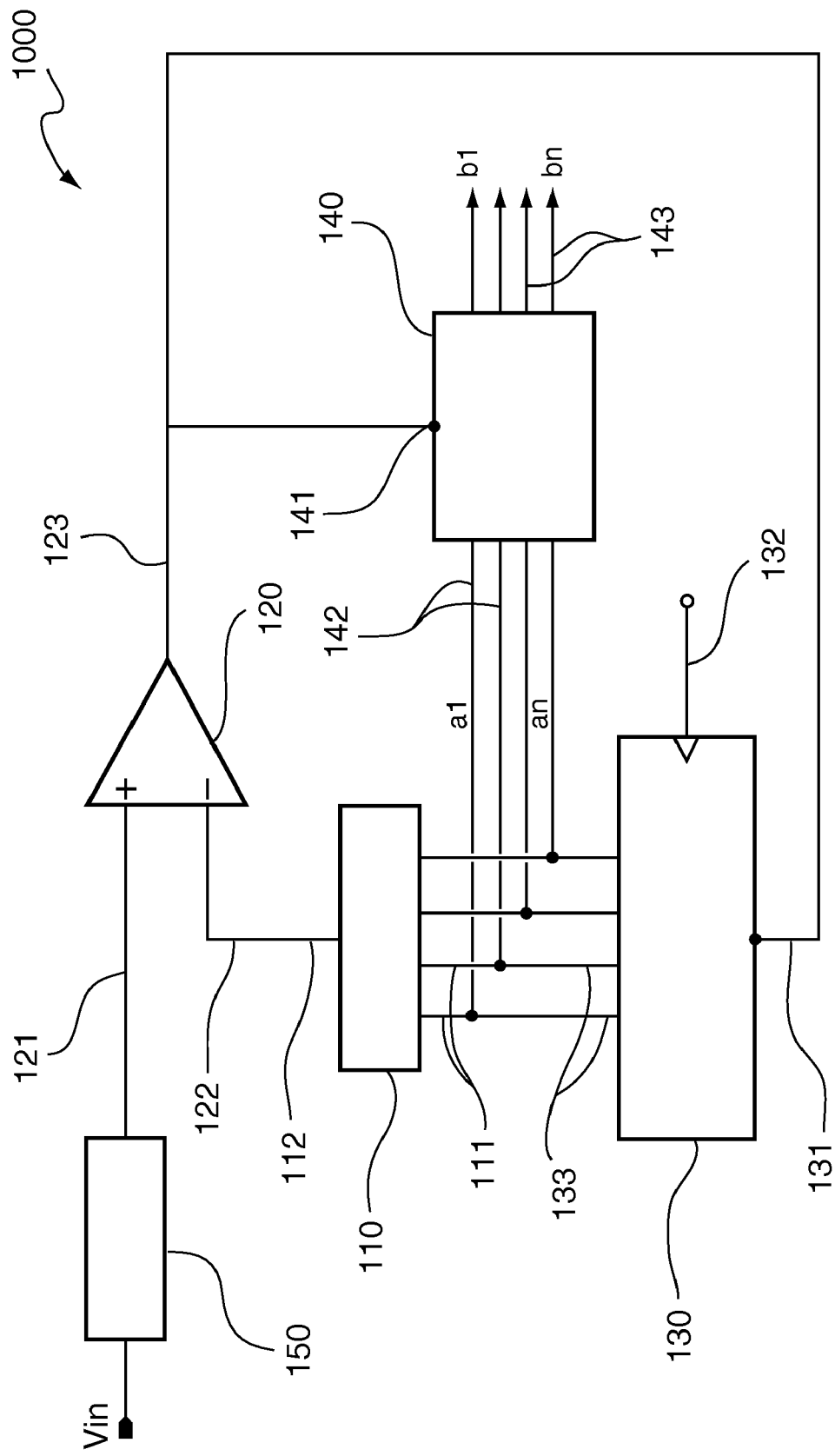
FIG. 1 is a simplified block diagram of a conventional successive approximation analog/digital converter.
Figure 2:
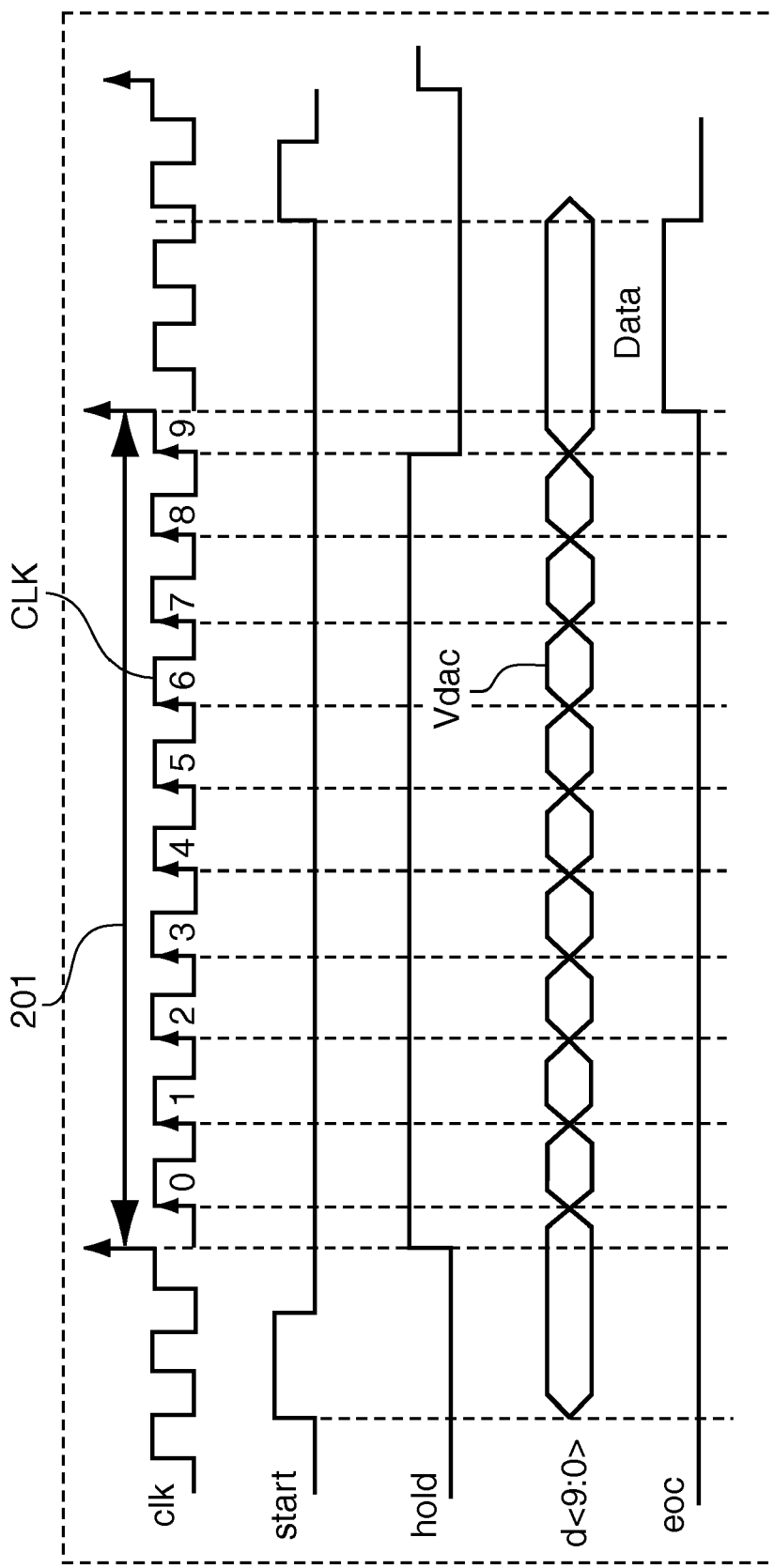
FIG. 2 shows time-dependent curves of the voltages CLK and signals coming from the outputs b1 to bn, over one conversion phase of the conventional successive approximation ADC of FIG. 1.
Figure 3:
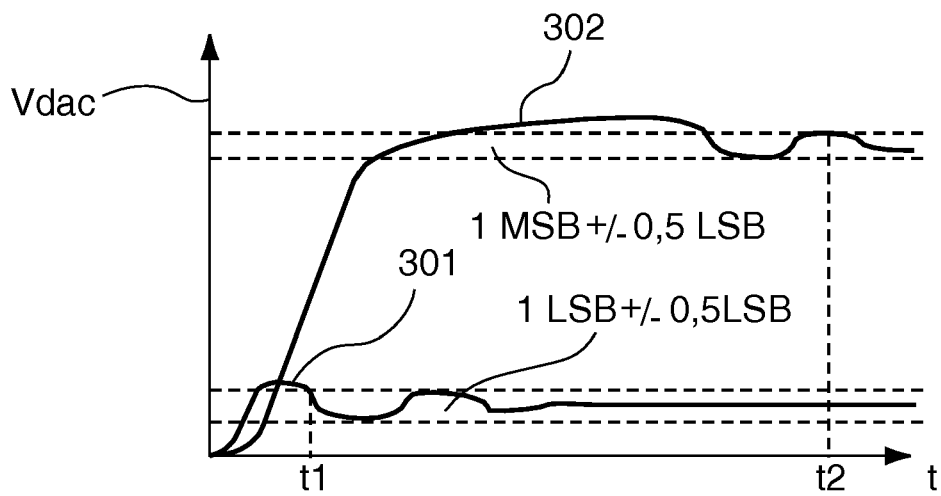
FIG. 3 shows curves of the signal Vdac in relation to time t, in the case where Vdac assumes the value of the least significant bit (curve 301), and in the case where Vdac assumes the value of the most significant bit (curve 302)
Figure 4:
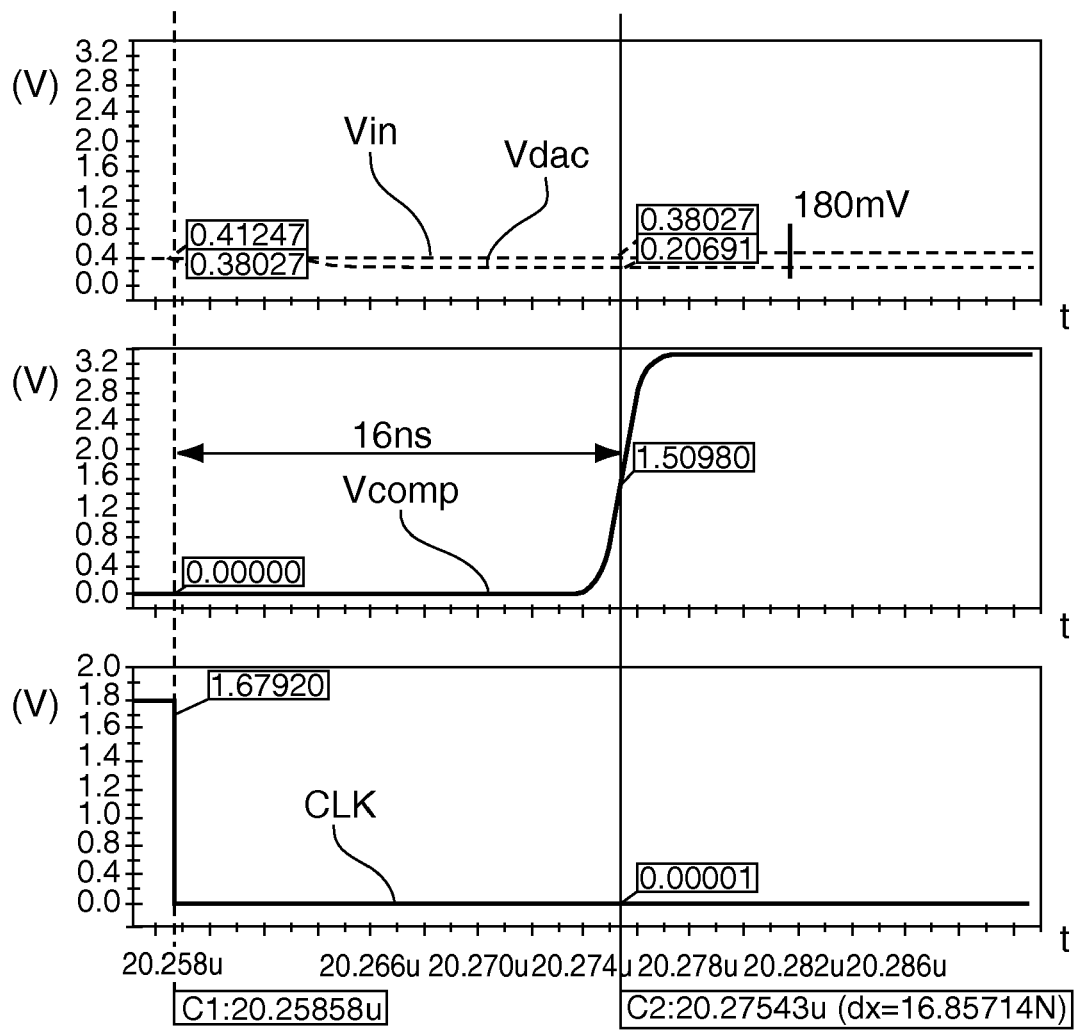
FIGS. 4 and 5 show curves for the voltages Vin, Vdac, Vcomp and CLK (in V) in relation to time t (in s), in the case where the voltage Vdac is substantially equal to 0.207 V and Vin is substantially equal to 0.380 V (FIG. 4), and in the case where the voltage Vdac is substantially equal to 0.380 V and Vin is substantially equal to 0.383 V.
Figure 5:
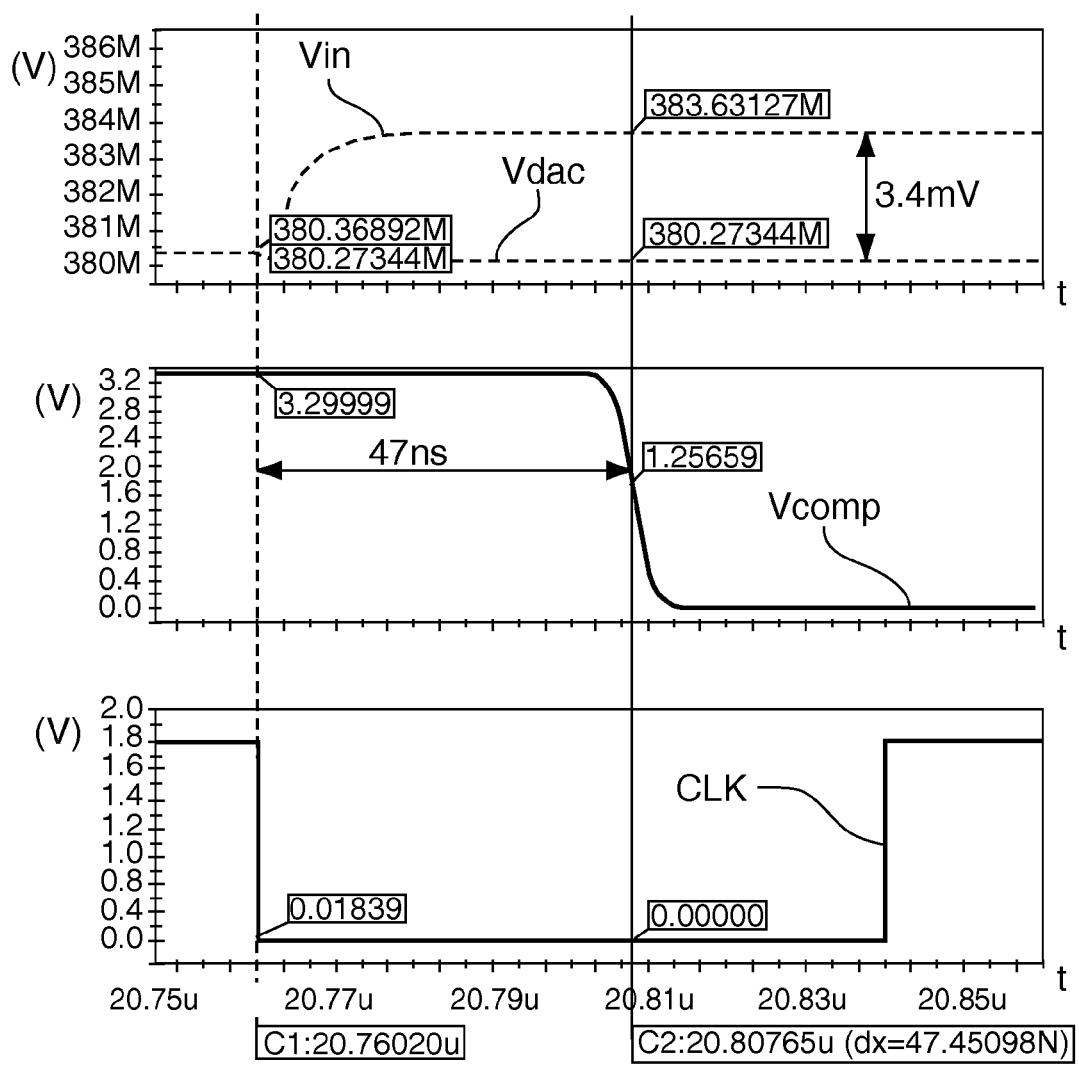
Figure 6:
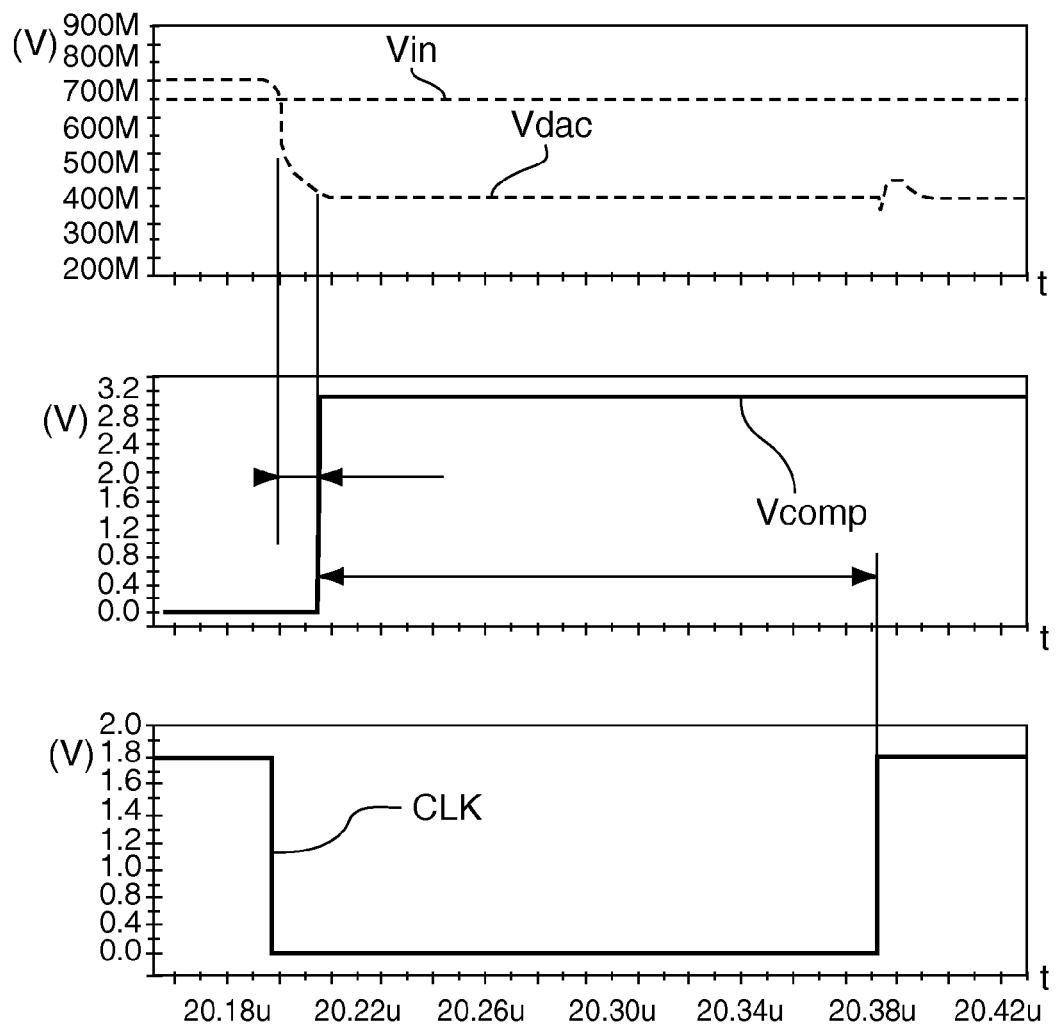
FIG. 6 shows curves for voltages Vin, Vdac, Vcomp and CLK (in V), in relation to time t (in ηs), in the case where Vin is substantially equal to 0.7 V and where the conversion clock period is substantially equal to 0.2 μs.

It can be noted that, in the same way as the successive approximation ADC 1000 of FIG. 1, the successive approximation ADC 7000 can (optionally) include a storage circuit (not shown in FIGS. 7, 8 and 10) serving to store the end-of-conversion results. This storage circuit is not indispensable to the operation of the successive approximation ADC according to the disclosure.

In this particular embodiment of the disclosure, this circuit 760 includes a multiplexer 761, a second comparator 762, which is identical to the first comparator 720, and a clock generator 763.

The multiplexer 761 includes:
- a first input 7611 connected to the output 754 (delivering the voltage Vin1) of the sample-and-hold device 750;
- a second input 7612 connected to the output 713 of the DAC 710 delivering the voltage Vdac;
- a third input 7613 connected to the output 7633 (delivering the clock voltage VCLKREF) of the clock generator 763;
- a first output 7614 connected to a first input 7621 of the second comparator 762; and
- a second output 7615 connected to a second input 7622 of the second comparator 762.

The multiplexer 761 functions as a switch connecting the signals Vin1 and Vdac to the first 7621 and second 7622 inputs, respectively, of the second comparator 762, during the half clock period CLKREF and to the second 7622 and first 7621 inputs, respectively, of the second comparator 762 during the half clock period CLKREF.

The second comparator 762 includes an output 7623 delivering an output voltage (or second comparison voltage) hereinafter referenced as Vnet145 (resulting from the comparison of the voltages applied to its first 7621 and second 7622 inputs by the first 7614 and second 7615 outputs of the multiplexer 761) and connected to a first input 7631 of the clock generator 763.

The clock generator 763 includes a first input 7631 connected to the output 7623 of the second comparator 762, a second input 7632 connected to the output 723 delivering the voltage Vcomp33 of the first comparator 720 and an output 7633 which delivers the clock voltage VCLKREF and which is connected to the second input 732 of the successive approximation register 730 and to the third input 7613 of the multiplexer 761.

Figure 8:
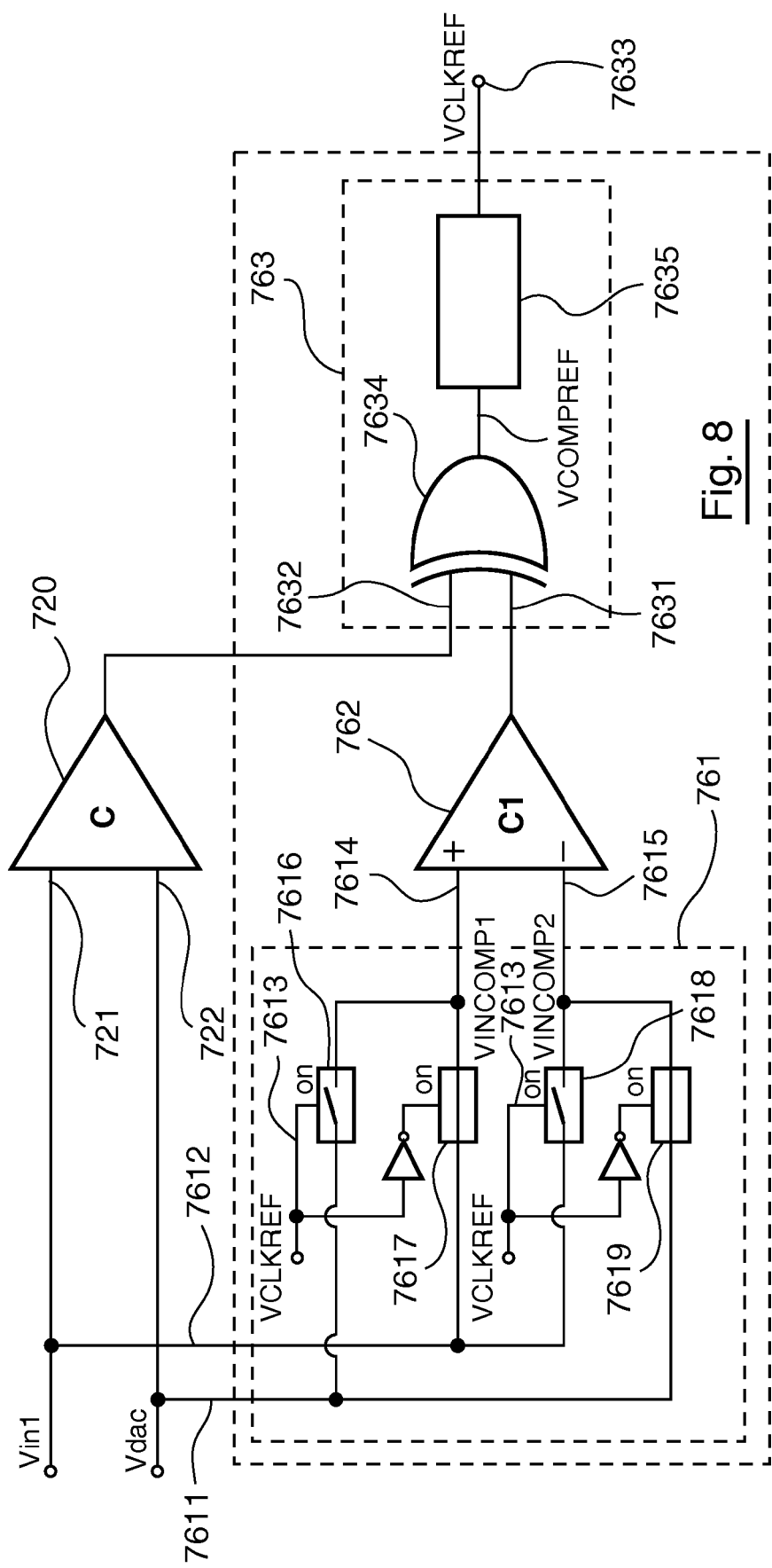
FIG. 8, according to one particular embodiment of the disclosure, shows a detailed circuit diagram of the dynamic adaptation circuit for the conversion clock period of the successive approximation ADC of FIG. 7.

FIG. 8 shows a detailed block diagram of the circuit for dynamic adaptation 760 (shown in FIG. 7) of the conversion clock period according to one particular embodiment of the disclosure.

Thus, the multiplexer 761 is produced by means of:
- first 7616 and second 7617 interrupters connecting the first 7611 input of the multiplexer 761 (which receives the voltage Vdac) to the first 7614 output of the multiplexer 761 (which delivers a voltage referenced hereinafter as Vincomp1) and the second 7612 input of the multiplexer 761 (which receives the voltage Vin1) to the first 7614 output of the multiplexer 761 (which delivers a voltage referenced hereinafter as Vincomp2), respectively, and which are controlled by the voltage VCLKREF and by the inverse of the voltage VCLKREF, respectively.
- third 7618 and fourth 7619 interrupters connecting the second 7612 input of the multiplexer 761 (which receives the voltage Vin1) to the second 7615 output of the multiplexer 761 (which delivers a voltage referenced hereinafter as Vincomp2) and the first 7611 input of the multiplexer 761 (which receives the voltage Vdac) to the second 7615 output of the multiplexer 761 (which delivers a voltage referenced hereinafter as Vincomp1), respectively, and which are controlled by the voltage VCLKREF and by the inverse of the voltage VCLKREF, respectively.

The clock generator 763 is produced by means of an EXCLUSIVE-OR gate the first and second inputs of which are connected to the first 7631 and second 7632 inputs of the clock generator 763, and the output of which, delivering an output voltage referenced hereinafter as VCOMPREF, is connected to a time-delay device 7635 (which is also part of the clock generator 763) the output of which is connected to the output 763 of the clock generator 763 (which delivers the voltage VCLKREF).

It is to be noted that the clock generator 763 may not include any time-delay device.

During a conversion phase, the output 713 of the DAC 710 generates decreasing voltages Vdac, according to the known and previously described principle of successive approximation converters. In a first conversion step, Vdac assumes a first value Vref/2 (which corresponds to a 1 at the second output a1 of the SAR 730).

The bits delivered by the second outputs a1 and a10 of the SAR 730 are the most significant bit (MSB) and the least significant bit (LSB), respectively.

The successive approximation register 730 sequences the analog/digital conversion (as described in detail below in relation to FIG. 9) by imposing a value of 1 to the most significant bit (MSB) of the second output a1 of the SAR 730, and then it controls the output 723 of the first comparator 720 so as to verify if the voltage Vdac is greater or less than the voltage Vin1. The voltage Vin1 is equal to the voltage Vin at the end of the sampling phase.

If the voltage Vdac is greater than Vin, then the successive approximation register 730 imposes a 0 on the bit of the second output a1 (MSB) of the SAR 730 and it imposes a value of 1 on the bit of the second output a2 of the SAR 730, and next, control of the output of the first comparator 720 is repeated.

In the opposite case, if the voltage Vin is greater than the voltage Vdac, then the successive approximation register 730 maintains a 1 on the bit of the second output a1 (MSB) of the SAR 730, and it imposes a value of 1 on the bit of the second output a2 of the SAR 730, and then control of the output of the first comparator 720 is repeated.

Thus, the time required for the 10-bit conversion phase of an analog voltage into a digital voltage is n=10 conversion clock periods (n is the number of bits of the analog/digital converter). To this time is added the length (m clock periods) of the sampling phase, during which the output Vin is connected to the output Vin1. The total conversion time is (m+n) clock periods.

The sample-and-hold device 750 is used to sample the input voltage Vin of the successive approximation ADC 7000 during the sampling phase and to keep it stable during the conversion phase.

The circuit 760 for dynamic adaptation of the conversion clock period is used to generate a clock voltage VCLKREF the period and cyclic ratio of which are dynamically adapted for each of the n=10 clock periods, in particular, based on;
- the DAC 710 converter set-up time (dependent on the Vdac voltage to be set up) and
- the response time of the first comparator 720, of that of the second comparator 762 and of the multiplexer 761 (depending, in particular, on the difference in voltage between Vin And Vdac).

According to alternative embodiments of this disclosure, the conversion clock period is dynamically adapted, in particular on the basis of at least one of the following parameters:
- the DAC 710 converter set-up time (dependent on the Vdac voltage to be set up) and
- the response time of the first comparator 720, of that of the second comparator 762 and of the multiplexer 761 (dependent, in particular, on the difference in voltage between Vin and Vdac);
- the input signal Vin of the analog/digital converter;

the operating temperature of the ADC 7000;

the ADC 7000 manufacturing method.

This adaptation is carried out by measuring the set-up time of the output voltage of the first comparator 720 and second comparator 762. This measurement takes account of the ADC 710 set-up time. The clock transitions take place either at the first 723 or the second 763 output of the comparators 720 and 762.

As illustrated hereinbelow, in relation to FIG. 9, the adaptation circuit 760 ensures the generation of two transitions for each conversion clock VCLKREF period regardless of the Vref voltage and Vin voltage to be converted.

As a matter of fact, the voltage Vcomp33, which depends on the absolute value of the difference between the voltages Vin and Vdac, does not switch from 0 to 1 at each conversion step. Thus, the multiplexer 761 and the first comparator 762 of the adaptation circuit 760 are responsible for generating the missing clock transitions which cannot be extracted from the voltage Vcomp33.

The voltages Vincomp1 and Vincomp2 are equal to Vdac and Vin, respectively, during a first portion of a clock period, and are equal to Vin and Vdac, respectively, during a second portion of the clock period. This mechanism of switching to Vincomp1 and Vincomp2 enables measurement of the response time of the first comparator 720 at the output 7623 of the second comparator 762, at the end of each first clock period portion, and makes it possible to provide additional clock transitions (not present at the output 723 of the comparator 720) to the clock voltage VCLKREF for each end of the second clock period VCLKREF. The time-delay device 7635 makes it possible to guarantee a minimum clock period width for the SAR 730 logic.

Figure 9:
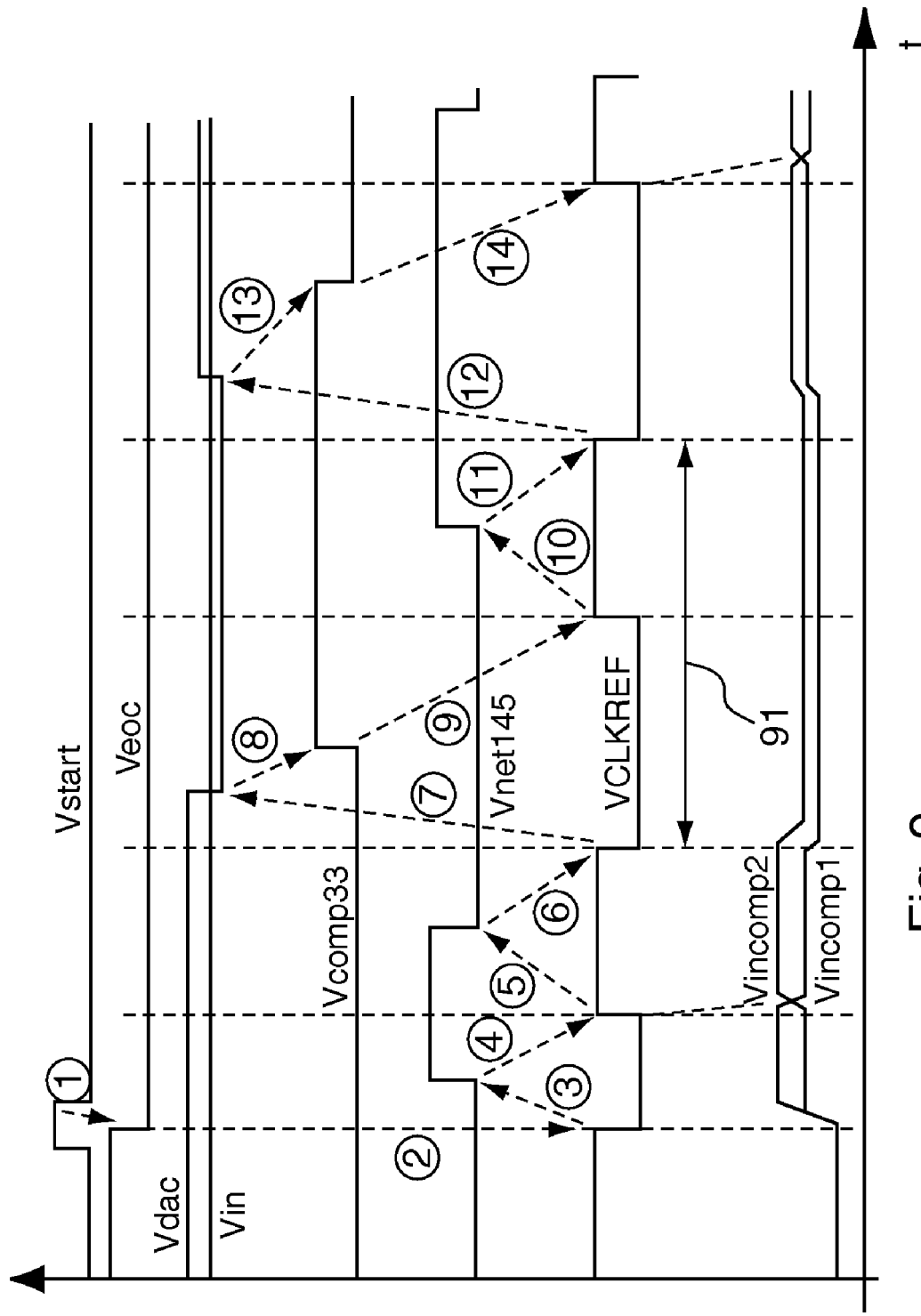
FIG. 9 shows curves showing the evolution, in relation to time t, of the voltages Vstart, Veoc, Vdac, Vin, Vcomp33, Vnet145, VCLKREF, Vincomp1 and Vincomp2 at the beginning of a conversion phase of the successive approximation ADC of FIG. 7.

FIG. 9 shows the operating principle of the circuit 760 for dynamic adaptation of the conversion clock period according to one particular embodiment of the disclosure shown in FIGS. 7 and 8.

FIG. 9 shows an example of the evolution of the voltages Vstart, Veoc, Vdac, Vin, Vcomp33, Vnet145, VCLKREF, Vincomp1 and Vincomp2, in relation to time t, at the beginning of a conversion phase.

Hereinafter, when speaking of high and low voltage values, for example, it is understood to mean a logic value of 1 and a logic value of 0, respectively.

Prior to the start of the conversion phase, for example, a sampling phase is carried out over three conversion clock periods.

The voltage Vref is a pre-selected constant reference voltage. It is equal to the maximum input voltage Vin anticipated at the input of the successive approximation ADC 7000.

The voltage Vref is associated with the technology used. For example, it is between 1 V and 1.8 V for 0.18-μm technology.

The given input voltage Vin of the ADC 7000 is stored in the sample-and-hold device 750 during the sampling phase.

At the end of the sampling phase, the voltage Vin applied to the first input 721 of the first comparator 720 and to the first input 7611 of the multiplexer 761 is equal to Vin1.

In a sub-step 1, a pulse signal Vstart is applied to the third input 733 of the successive approximation register 730. Then, the voltage Veoc shifts from a high value to a low value (e.g., 0V). In the same way, the voltage VCLKREF shifts from a high value to a low value.

Then, in a sub-step 2, the ADC 7000 switches from the sampling phase to the conversion phase. The voltage at the sample-and-hold device output 750 remains set at Vin1 during the conversion phase, when the second input 753 is clamped at 1 by the SAR 730. The sample-and-hold device 750 then shifts to the "input voltage hold" mode.

For example, a Vin value of between Vref/4 and Vref/4+ Vref/8 is chosen.

Due to the fact that the signal Veoc is at its low value, the voltage VCLKREF is a copy of the voltage VCOMPREF offset by the time delay 7635 (as indicated above, a time delay 7635 such as this is implemented so as to ensure a minimum value for the conversion clock period). For example, the time delay is 20 ns.

The DAC 710 therefore applies a voltage Vref/2, corresponding to the MSB, to the second input 722 of the first comparator 720, and to the input 7612 of the multiplexer 761.

Due to the fact that the voltage Vin1 applied to the first input 721 of the first comparator 720 and the input 7611 of the multiplexer 761 is lower than the voltage Vdac=Vref/2 applied to the second input 722 of the first comparator 720 and to the input 7612 of the multiplexer 761, the voltage Vcomp33 (delivered by the output 723 of the first comparator 720) is at its low value.

In a sub-step 3, due to the fact that the voltage VCLKREF is at its low value, the voltage Vincomp1 is equal to the voltage Vdac (which is also applied to the second input 722 of the first comparator 720) and the voltage Vincomp2 is equal to the voltage Vin1 (which is also applied to the first input 721 of the first comparator 720), the voltage Vnet145 thus assumes its high value, after the response time of the second comparator 762 has elapsed (which depends on the difference between the voltage Vincomp1=Vdac and the voltage Vincomp2=Vin1).

Thus, the voltage VCOMPREF, which is the output of the EXCLUSIVE-OR gate 7634 (to which Vcomp33 and Vnet145 is applied), assumes its high value. Thus, VCLKREF assumes its high value in a sub-step 4 (following the offset due to the time delay 7635).

In a sub-step 5, due to the fact that the voltage VCLKREF is at its high value, the voltage Vincomp1 is equal to the voltage Vin1 (which is also applied to the first input 721 of the first comparator 720) and the voltage Vincomp2 is equal to the voltage Vdac (which is also applied to the second input 722 of the first comparator 720), the voltage Vnet145 thus assumes its low value, after the response time of the second comparator 762 has elapsed (which depends on the difference between the voltage Vincomp1=Vin1 and the voltage Vincomp2=Vdac). Thus, the inputs of the second comparator 762 are inverted after VCLKREF has been switched.

Therefore, the voltage VCOMPREF, which is the output of the EXCLUSIVE-OR gate 7634 (to which the Vcomp33 and Vnet145 are applied), assumes its low value. Thus, VCLKREF assumes its low value in sub-step 6 (following the offset due to the time delay 7635).

Then, the low value of the voltage Vcomp33 results in a resetting of the most significant bit (MSB) to 0 at the second output a1 of the successive approximation register 730, at the moment when VCLKREF assumes its low value.

In a sub-step 7, the DAC 710 applies a voltage Vref/4 to the second input 722 of the first comparator 720 and to the input 7612 of the multiplexer 761 (after the time for setting up this voltage Vref/4 by the DAC 710 has elapsed).

In a sub-step 8, due to the fact that the voltage Vin1 applied to the first input 721 of the first comparator 720 is higher than the voltage Vdac=Vref/4 applied to the second input 722 of the first comparator 720, the voltage Vcomp33 assumes its high value, after the response time of the first comparator 720 has elapsed (which depends on the difference between the voltage Vin1 and the voltage Vdac=Vref/4).

Due to the fact that the voltage VCLKREF is at its low value, the voltage Vincomp1 is equal to the voltage Vdac and the voltage Vincomp2 is equal to the voltage Vin1 (which is higher than the voltage Vdac), thus, the voltage Vnet145 retains its low value.

Therefore, the voltage VCOMPREF assumes its high value. In this way, in a sub-step 9, VCLKREF assumes its high value (following the offset due to the time delay 7635).

In a sub-step 10, due to the fact that the voltage VCLKREF is at its low value, the voltage Vincomp1 becomes equal to the voltage Vin1, and the voltage Vincomp2 becomes equal to the voltage Vdac (which is lower than Vin), and thus, after the response time of the second comparator 762 has elapsed (which depends on the difference between the voltage Vincomp1=Vin1 and the voltage Vincomp2=Vdac), the voltage Vnet145 assumes its high value.

Thus, in a sub-step 11, VCOMPREF, which is the output of the EXCLUSIVE-OR gate 7634 (to which Vcomp33 and Vnet145 are applied), assumes its low value, and VCLKREF assumes its low value (following the offset due to the time delay 7635). Thus, the inputs of the second comparator 762 are inverted after VCLKREF has been switched.

Then, due to the fact that the voltage Vin1 is higher than the voltage Vdac, the value of 1 is maintained at the second output a2 of the successive approximation register 730, at the moment when VCLKREF assumes its low value.

Thus, in a sub-step 12, the DAC 710 applies a voltage Vref/4+Vref/8 (after the time for setting up this voltage Vref/4+Vref/8 by the DAC 710 has elapsed) to the second input 722 of the first comparator 720 and to the input 7612 of the multiplexer 761.

In a sub-step 13, due to the fact that the voltage Vin1 applied to the first input 721 of the first comparator 720 is lower than the voltage Vdac=Vref/4+Vref/8 applied to the second input 722 of the first comparator 720, the voltage Vcomp33 assumes its low value after the response time of the first comparator 720 has elapsed (which depends on the difference between the voltage Vin1 and the voltage Vdac=Vref/4+Vref/8).

Due to the fact that the voltage VCLKREF is at its low value, the voltage Vincomp1 is equal to the voltage Vin1 and the voltage Vincomp2 is equal to the voltage Vdac (which is lower than the voltage Vin1), the voltage Vnet145 thus retains its high value.

Thus, the voltage VCOMPREF assumes its high value. In this way, in a sub-step 14, VCLKREF assumes its high value (following the offset due to the time delay 7635).

The method is repeated in this way until the end of the conversion phase (for the sake of clarity, only sub-steps 1 to 14 have been shown in this FIG. 9). As a matter of fact, at the end of the tenth conversion clock period (thus at the end of the tenth conversion step), the voltage Veoc re-assumes its high value and the voltage VCLKREF is replaced with a voltage VCLK delivered by an external clock by means of an inverter-based 773 circuit 770 (shown below in FIG. 10) with two AND gates 771 and one OR gate 772.

In this way, the complementary switching operations of the first 762 and second 763 multiplexers are used in combination with the switching operations of the output of the first comparator 720 in order to generate the leading and trailing edges of the conversion clock VCLKREF. Owing to the present disclosure, therefore, the period and cyclic ratio of this clock VCLKREF are adapted continuously during the conversion phase, on the basis of the DAC 710 set-up times and response times of the first comparator 720, on the one hand, and of the multiplexer 761 and second comparator 762, on the other hand.

The comparators 720 and 762 are preferably identical, in order to obtain very close propagation times for a given difference in voltage |Vin1−Vdac|.

According to a preferred embodiment of the disclosure, the multiplexer 761 switching time is chosen to be as short as possible, and is much less than the comparator response time.

Figure 10:
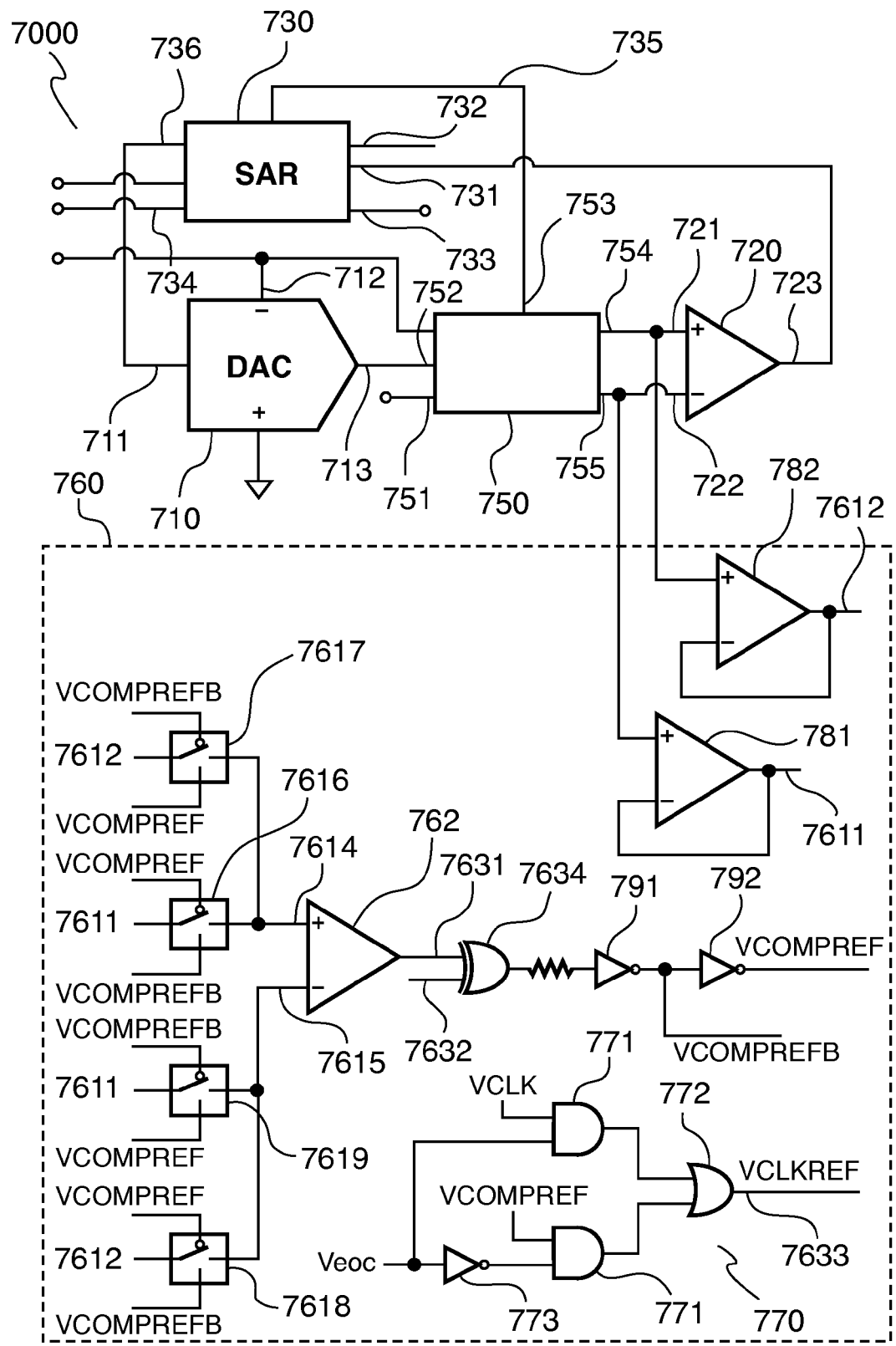
FIG. 10 shows a diagram of a particular implementation of the successive approximation analog/digital converter of FIG. 7.

FIG. 10 shows a diagram of one particular implementation of the successive approximation analog/digital converter 7000, according to the particular embodiment of the disclosure.

For the sake of clarity, only one link is shown between the ten outputs 736 of the SAR 730 and ten inputs 711 of the DAC 710.

In FIG. 10:

no time delay 7635 has been shown;

the inverted voltage VCLKREF is designated by VCOMPREFB;

two follower amplifier-type assemblies 781 and 782 are implemented between the first output 754 of the sample-and-hold device 750 and the first input 7611 of the multiplexer 761, and between the second output 755 of the sample-and-hold device 750 and the second input 7612 of the multiplexer 761, respectively, so as to insulate the dynamic adaptation circuit 760 from the sample-and-hold device 750, in order to prevent the noise resulting from the switching of the interrupters 7616 to 7619 from interfering with the sample-and-hold device 750.

In this implementation, two inverters 791 and 792 acting as buffers are used at the output of the EXCLUSIVE-OR gate 7634, so as to reduce the rise and fall times of the voltage VCOMPREF.

Figure 11A:
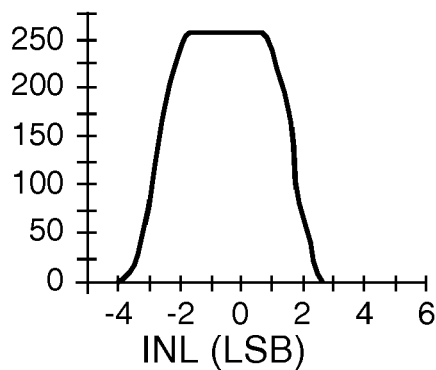
FIGS. 11A to 11D are diagrams representing the conversion error and time frequency distribution in the case where, in accordance with an exemplary aspect of the disclosure, dynamic adaptation of the conversion clock period is implemented (FIGS. 11C and 11D), and in the conventional case where the conversion clock period is constant (FIGS. 11A and 11B).
Figure 11B:
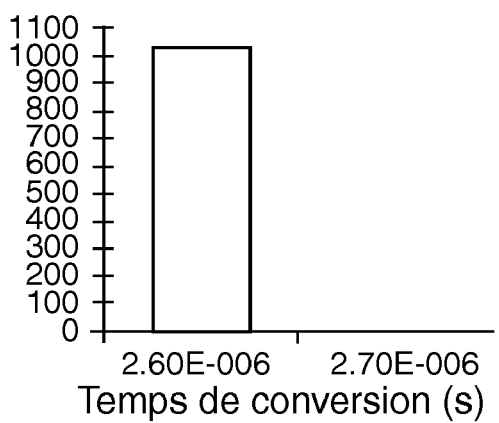

FIGS. 11A to 11D are diagrams showing error distribution (or integral non-linearity or INL) in LSB in the encoding of Vin and the conversion time distribution (in s) of the successive approximation ADC 7000, in the case where dynamic adaptation of the conversion clock period is implemented (FIGS. 11C and 11D), and in the conventional case where the conversion clock period is constant (FIGS. 11A and 11B).

Figure 11C:
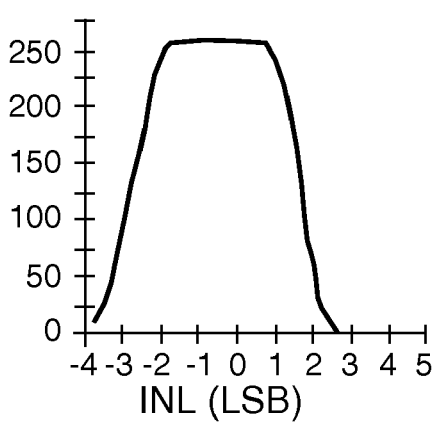

In the graphs of FIGS. 11A and 11C, the x-axis represents error or integral non-linearity in LSB, and the y-axis represents the number of voltage values Vin (between 0 and 1024) which have been encoded with a given error.

Figure 11D:
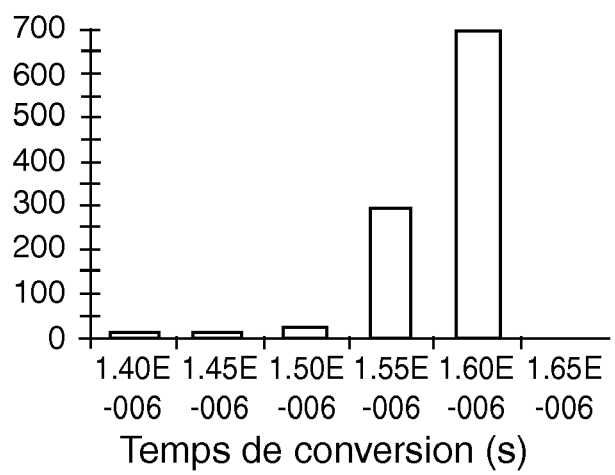

In the graphs of FIGS. 11B and 11D, the x-axis represents error or integral non-linearity in LSB, and the y-axis represents the number of voltage values Vin (between 0 and 1024) which have been encoded with a given conversion time.

It can be noted that, by implementing the dynamic adaptation of the conversion clock period in accordance with the disclosure, it is possible to:

shorten the duration of the conversion phase. The total duration of the conversion phase varying from 1.4 µS to 1.6 µS, based on the input voltage; the total duration of the conversion phase otherwise being 2.6 µS with the conventional solution wherein the conversion clock period is constant;

keep the conversion errors lower than or equal to those obtained with the conventional solution wherein the conversion clock period is constant. Integral non-linearity is the difference between the digital code obtained, on the one hand, at the output of an ideal ADC and, on the other hand, at the output of the converter tested, with either a variable-pitch clock, in accordance with the disclosure, or with the conventional solution wherein the conversion clock period is constant.

Of course, a circuit for dynamic adaptation of the conversion clock period according to the disclosure can be implemented in any successive approximation analog/digital converter.

In addition, this disclosure applies, in particular, to both successive approximation ADC architectures using switched capacitors and to successive approximation ADC architectures using linear techniques.

It is recalled that linear techniques use resistive or current generator-based components, as well as amplifiers.

Non-linear techniques use capacitors switched by a reference clock, so as to emulate resistive components and current sources. The advantage of switched capacitors is based on the accuracy of clock-dependent devices (which can be very accurate) and on the matching of (well-controlled) capacitive components.

One or more aspects of the present disclosure mitigate inconveniences of the prior.

More precisely, at least one of the embodiments of the disclosure provides a technique enabling improvement in the conversion speed of a successive approximation analog/digital converter.

At least one of embodiment of the disclosure implements such a technique which, in particular, makes it possible to reduce the time lost during the conversion phase, which is due to the conversion clock period.

At least one of embodiment of the disclosure provides such a technique such as this which can be implemented simply and inexpensively.

Although the present disclosure has been described with reference to one or more examples, workers skilled in the art will recognize that changes may be made in form and detail without departing from the spirit and scope of the disclosure or the appended claims.

What is claimed is:

1. A successive approximation analog/digital converter comprising:
   a successive approximation register supplying a digital/analog converter, and being synchronised by a clock signal coming from a conversion clock;
   a first comparator comparing an input signal of the analog/digital converter to an output signal of the digital/analog converter and delivering a first comparison signal; and
   a dynamic adaptation circuit, which:
      includes a measurement circuit, which measures at least one of the following parameters: (a) at least one response time of the first comparator; (b) at least one set-up time for at least one analog voltage via the digital/analog converter; and
      dynamically adapts the clock signal period, taking account of at least one parameter measured by said measurement circuit.

2. The converter of claim 1, wherein the measurement circuit includes a second comparator comparing the input signal of the analog/digital converter to the output signal of the digital/analog converter and delivering a second comparison signal supplying a clock generator, which generates said clock signal, wherein the clock generator takes account of said first and second comparison signals.

3. The converter of claim 2, wherein the measurement circuit is adapted for also measuring at least one of the following first supplemental parameters: at least one response time of the second comparator, and wherein dynamic adaptation circuit also takes account of at least one measured first supplemental parameter, to adapt the clock signal period.

4. The converter of claim 2, wherein the first and second comparators are identical.

5. The converter of claim 2, wherein the measurement circuit includes a multiplexer, which multiplexes the input signal of the analog/digital converter and the output signal of the digital/analog converter to the first and second inputs of the second comparator taking account of the clock signal.

6. The converter of claim 5, wherein the multiplexer includes at least one interrupter controlled by the clock signal and at least one interrupter controlled by the inverse of the clock signal.

7. The converter of claim 2, wherein said clock generator includes at least one EXCLUSIVE-OR gate.

8. The converter of claim 2, wherein said clock generator includes a time-delay device applied to said clock signal.

9. The converter claim 1, wherein the dynamic adaptation circuit includes an insulator, which insulates the analog/digital converter from noise generated by the dynamic adaptation circuit.

10. The converter of claim 9, wherein said insulator includes at least one follower amplifier assembly.

11. The converter of claim 1, wherein the dynamic adaptation circuit also takes account of at least one second supplemental parameter, to adapt the clock signal period, said second supplemental parameter belonging to the group comprising:
   an input signal of the analog/digital converter;
   an operating temperature of the analog/digital converter;
   a method of manufacturing the analog/digital converter.

12. An integrated component comprising a successive approximation analog/digital converter, which comprises:
   a successive approximation register supplying a digital/analog converter, and being synchronised by a clock signal coming from a conversion clock;
   a first comparator comparing an input signal of the analog/digital converter to an output signal of the digital/analog converter and delivering a first comparison signal; and
   a dynamic adaptation circuit, which:
      includes a measurement circuit, which measures at least one of the following parameters: (a) at least one response time of the first comparator; (b) at least one set-up time for at least one analog voltage via the digital/analog converter; and
      dynamically adapts the clock signal period, taking account of at least one parameter measured by said measurement circuit.

13. A successive approximation method of convening an analog input signal into a digital output signal, the method comprising:
   implementing a successive approximation analog/digital converter comprising a successive approximation register supplying a digital/analog converter, a first comparator comparing an input signal of the analog/digital converter to an output signal of the digital/analog converter and delivering a first comparison signal, said successive approximation conversion being synchronised by a clock signal coming from a conversion clock;
   measuring at least one of the following parameters: (a) at least one response time of the first comparator; (b) at least one set-up time for at least one analog voltage via the digital/analog converter; and
   dynamically adapting the clock signal period taking account of at least one of the measured parameters.

* * * * *